(12) United States Patent  
Takahashi et al.

(10) Patent No.: US 7,227,195 B2
(45) Date of Patent: Jun. 5, 2007

(54) LED LAMP INCLUDING A PLURALITY OF LED CHIPS

(75) Inventors: Kiyoshi Takahashi, Kyotanabe (JP); Tomoaki Ono, Kurashiki (JP); Noriyasu Tanimoto, Takatsuki (JP); Toshifumi Ogata, Sakai (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/209,906

(22) Filed: Aug. 23, 2005

(65) Prior Publication Data

US 2005/0274973 A1 Dec. 15, 2005

Related U.S. Application Data

(63) Continuation of application No. PCT/JP2005/002692, filed on Feb. 21, 2005.

(30) Foreign Application Priority Data

Feb. 26, 2004 (JP) ............................. 2004-051075

(51) Int. Cl.
*H01L 33/00* (2006.01)
(52) U.S. Cl. ........................... 257/100; 257/98; 438/22
(58) Field of Classification Search ................. 257/81, 257/82, 88, 98, 99, 100; 438/22, 24, 25, 438/26, 27, 29, 46, 47; 313/512
See application file for complete search history.

(56) References Cited

U.S. PATENT DOCUMENTS 3,875,456 A 4/1975 Kano et al.

(Continued)

FOREIGN PATENT DOCUMENTS

| GB | 2 206 444 A | 1/1989 |
| JP | 05-290818 A | 11/1993 |
| JP | 10-056208 A | 2/1998 |

(Continued)

OTHER PUBLICATIONS

IPACK2003-35335: Desmond Y.R. Chong, C.K. Wang, K.C. Fong and Pradeep Lall, "Finite Element Parametric Analysis on Fine-Pitch BGA (FBGA) Packages", Proceedings of IPACK03, International Electronic Packaging Technical Conference and Exhibition, Jul. 2003.*
U.S. Appl. No. 10/543,243, filed Jul. 2005, Yano et al.

*Primary Examiner*—Sara Crane
*Assistant Examiner*—Ajay Arora
(74) *Attorney, Agent, or Firm*—Akin Gump Strauss Hauer & Feld LLP (57) ABSTRACT

An LED lamp according to the present invention includes: a substrate 10 having a principal surface 10*a*; at least one LED 12, which is supported on the principal surface 10*a* of the substrate 10; a reflector 16, which has an opening that defines a reflective surface 14 surrounding the side surface of the LED 12 and which is supported on the principal surface 10*a* of the substrate 10; and an encapsulating resin layer 18, which covers the LED 12 and the reflector 16 together. When a portion of the encapsulating resin layer 18 that covers the side surfaces 16*w* of the reflector 16 has a thickness Dw and another portion of the encapsulating resin layer 18 that covers the upper surface 16*h* of the reflector 16 has a thickness Dh, the LED lamp has a Dh/Dw ratio of 1.2 to 1.8.

13 Claims, 9 Drawing Sheets

U.S. PATENT DOCUMENTS

| | | | |
|---|---|---|---|
| 5,055,892 A * | 10/1991 | Gardner et al. | 257/99 |
| 5,847,507 A | 12/1998 | Butterworth et al. | |
| 5,998,925 A | 12/1999 | Shimizu et al. | |
| 6,340,824 B1 | 1/2002 | Komoto et al. | |
| 6,345,903 B1 * | 2/2002 | Koike et al. | 362/249 |
| 6,417,019 B1 | 7/2002 | Mueller et al. | |
| 6,611,000 B2 * | 8/2003 | Tamura et al. | 257/80 |
| 6,614,179 B1 * | 9/2003 | Shimizu et al. | 313/512 |
| 6,863,410 B2 * | 3/2005 | Yoshii et al. | 359/858 |
| 2001/0042865 A1 * | 11/2001 | Oshio et al. | 257/100 |
| 2002/0130326 A1 | 9/2002 | Tamura et al. | |
| 2003/0189829 A1 | 10/2003 | Shimizu et al. | |
| 2004/0100192 A1 | 5/2004 | Yano et al. | |

FOREIGN PATENT DOCUMENTS

| | | |
|---|---|---|
| JP | 10-065221 A | 3/1998 |
| JP | 11-340378 A | 12/1999 |
| JP | 2000-022220 A | 1/2000 |
| JP | 2000-031547 A | 1/2000 |
| JP | 2001-358370 A | 12/2001 |
| JP | 2002-324313 A | 11/2002 |
| JP | 2003-059332 A | 2/2003 |
| JP | 2003-304004 A | 10/2003 |
| WO | WO 01/82385 A1 | 11/2001 |

* cited by examiner

PRIOR ART

LED LAMP INCLUDING A PLURALITY OF LED CHIPS

This is a continuation of International Application PCT/JP2005/002692, with an international filing date of Feb. 21, 2005.

BACKGROUND OF THE INVENTION

1. Field of the Invention

The present invention relates to an LED lamp and more particularly relates to an LED lamp that can be used as a white light source for general illumination.

2. Description of the Related Art

A light emitting diode (LED chip) is a semiconductor device that can radiate an emission in a bright color with high efficiency even though its size is small. The emission of an LED chip has an excellent monochromatic peak. To obtain white light from LED chips, a conventional LED lamp arranges red, green and blue LED chips close to each other and gets the light rays in those three different colors diffused and mixed together. An LED lamp of this type, however, easily produces color unevenness because the LED chip of each color has an excellent monochromatic peak. That is to say, unless the light rays emitted from the respective LED chips are mixed together uniformly, color unevenness will be produced inevitably in the resultant white light. Thus, to overcome such a color unevenness problem, an LED lamp for obtaining white light by combining a blue LED chip and a yellow phosphor was developed (see Japanese Patent Application Laid-Open Publication Nos. 10-242513 and 10-56208, for example).

According to the technique disclosed in Japanese Patent Application Laid-Open Publication No. 10-242513, white light is obtained by combining together the emission of a blue LED chip and the yellow emission of a yellow phosphor, which is produced when excited by the emission of the blue LED chip. That is to say, the white light can be obtained by using just one type of LED chips. Accordingly, the color unevenness problem, which arises when white light is produced by arranging multiple types of LED chips close together, is avoidable.

Figure 11:
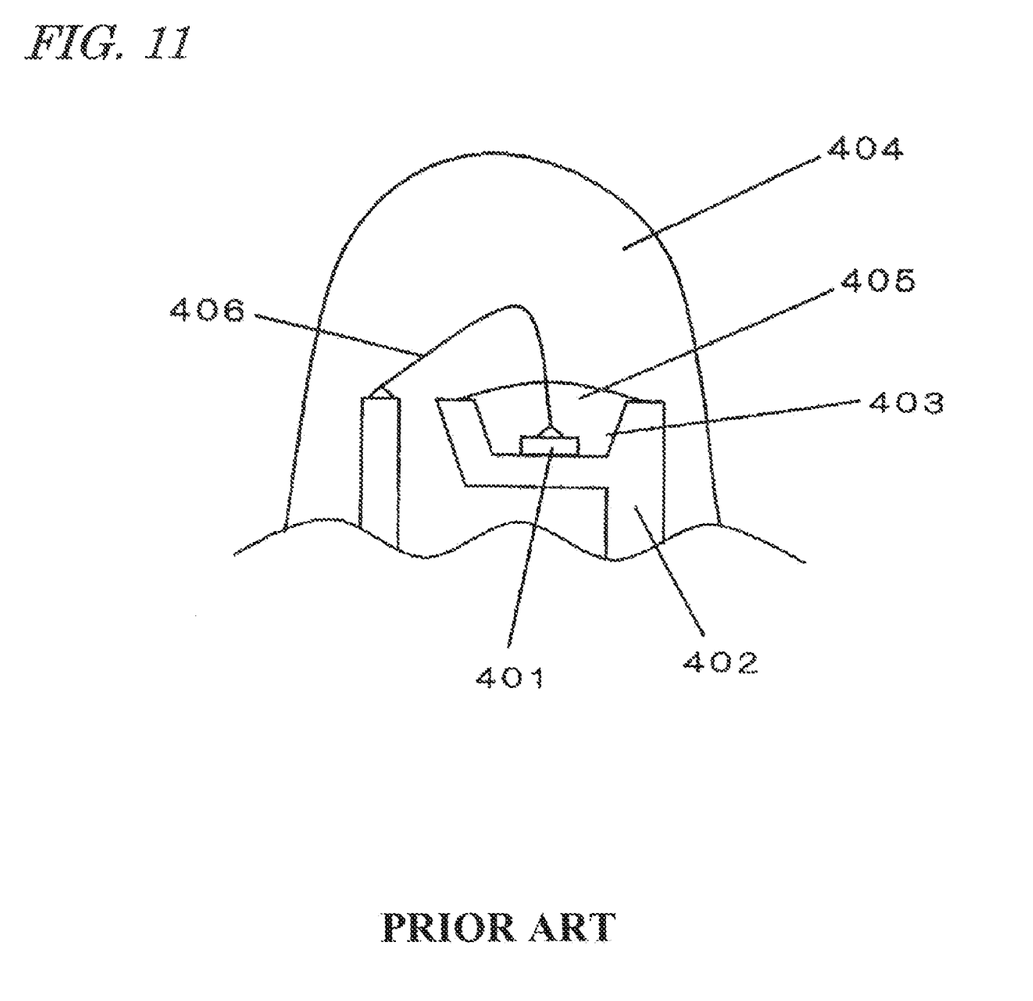
FIG. 11 is a cross-sectional view of a conventional LED lamp.

An LED lamp as disclosed in Japanese Patent Application Laid-Open Publication No. 10-56208 may have a configuration such as that illustrated in FIG. 11, for example. In the LED lamp shown in FIG. 11, the inside of a cup 403 that mounts an LED chip 401 thereon is encapsulated with a first resin 405, in which a phosphor is dispersed and which is further encapsulated with a second resin 404. A drive current is supplied to the LED chip 401 by way of a lead 402 and a wire 406. The emission of the LED chip 401 is converted by the phosphor included in the first resin 405 into light having a longer wavelength than that of the emission. The emission of the LED chip 401 and the light converted by the first resin 405 cause color mixture, thereby producing light in a desired color. If the LED chip 401 emits a blue light ray and the phosphor included in the first resin 405 produces a yellow light ray responsive to the blue ray, then the blue and yellow light rays are mixed together to produce white light.

However, the luminous flux of a single LED chip is too low. Accordingly, to obtain a luminous flux comparable to that of an incandescent lamp, a fluorescent lamp or any other general illumination used extensively today, an LED lamp preferably includes a plurality of LED chips that are arranged as an array on the same substrate. An LED lamp of that type is disclosed in Japanese Patent Application Laid-Open Publication No. 2003-124528, for example.

When a lot of LED chips are mounted highly densely on the same substrate, those LED chips arranged are molded together with a resin on the principal surface of the substrate. This is because the manufacturing process can be carried out more easily than otherwise. However, the present inventors discovered and confirmed via experiments that an LED lamp, subjected to such a resin molding process, is likely to have splits or cracks in the interface between the encapsulating resin layer and the substrate due to a heat shock and the encapsulating resin layer is likely to produce leakage. Once such leakage happens, the LED chip deteriorates by absorbing water in the air. As a result, the reliability of the LED chip decreases and its life shortens, thus causing a serious inconvenience in practice.

SUMMARY OF THE INVENTION

In order to overcome the problems described above, a primary object of the present invention is to provide an LED lamp with improved reliability and extended life by minimizing splits or cracks in the encapsulating resin layer due to a thermal shock.

An LED lamp according to the present invention includes: a substrate having a principal surface; at least one LED chip, which is supported on the principal surface of the substrate; a reflector, which has an opening that defines a reflective surface surrounding the side surface of the LED chip and which is supported on the principal surface of the substrate; and an encapsulating resin layer, which covers the LED chip and the reflector together. When portion of the encapsulating resin layer that covers the side surfaces of the reflector has a thickness Dw and another portion of the encapsulating resin layer that covers the upper surface of the reflector has a thickness Dh, the LED lamp has a Dh/Dw ratio of 1.2 to 1.8.

In one preferred embodiment, the LED lamp further includes a wavelength converting portion, which is arranged between the inner wall of the opening of the reflector and the LED chip so as to cover the LED chip. The wavelength converting portion converts the emission of the LED chip into light that has a longer wavelength than that of the emission.

In another preferred embodiment, the wavelength converting portion is made of a resin that includes a phosphor for converting the emission of the LED chip into the light that has the longer wavelength than that of the emission.

In another preferred embodiment, a portion of the encapsulating resin layer, located over the opening of the reflector, has a convex lens shape that sticks out of the portion that covers the upper surface of the reflector.

In another preferred embodiment, the LED chip generates a heat of 1 $W/cm^2$ or more during its operation.

In another preferred embodiment, two or more LED chips, including the at least one LED chip, are supported on the principal surface of the substrate.

In another preferred embodiment, the substrate has a thermal expansion coefficient $n_1$ of $0.4 \times 10^{-5}$/K to $2.5 \times 10^{-5}$/K, the encapsulating resin layer has a thermal expansion coefficient $n_2$ of $6.0 \times 10^{-5}$/K to $8.0 \times 10^{-5}$/K, and the reflector has a thermal expansion coefficient $n_3$ of $2.3 \times 10^{-5}$/K to $8.6 \times 10^{-5}$/K.

In another preferred embodiment, Dh is 100 μm to 1,500 μm and Dw is 100 μm to 1,500 μm.

In yet another preferred embodiment, Dw is 100 μm to 900 μm.

In another preferred embodiment, the reflector is a flat plate with the opening.

In another preferred embodiment, the reflector has at least four openings including the opening.

In another preferred embodiment, the encapsulating resin layer is made of a material consisting essentially of an epoxy resin.

In another preferred embodiment, the encapsulating resin layer covers the entire upper surface of the reflector.

In another preferred embodiment, the upper surface of the reflector has a rectangular profile.

An illumination unit according to the present invention includes an LED lamp according to any of the preferred embodiments described above and a circuit for supplying electrical power to the LED lamp.

A method for fabricating an LED lamp according to the present invention includes the steps of: making a structure including a substrate having a principal surface, at least one LED chip supported on the principal surface of the substrate and a reflector having an opening that defines a reflective surface surrounding the side surface of the LED chip and supported on the principal surface of the substrate; making a molding die that defines the shape of an encapsulating resin layer that covers the LED chip and the reflector; aligning the molding die with respect to the substrate such that a predetermined gap is created between the inner walls of the molding die and the upper and side surfaces of the reflector; and injecting a resin into the gap and then curing the resin, thereby making the encapsulating resin layer that covers the LED chip and the reflector. When a portion of the encapsulating resin layer that covers the side surfaces of the reflector has a thickness Dw and another portion of the encapsulating resin layer that covers the upper surface of the reflector has a thickness Dh, the method includes the step of setting a Dh/Dw ratio within the range of 1.2 to 1.8.

According to the present invention, by adjusting the thickness of the encapsulating resin layer that covers the reflector, the deterioration of the encapsulating resin layer due to a thermal shock can be minimized and an LED lamp with improved reliability and extended life can be provided.

DETAILED DESCRIPTION OF PREFERRED EMBODIMENTS

Figure 1A:
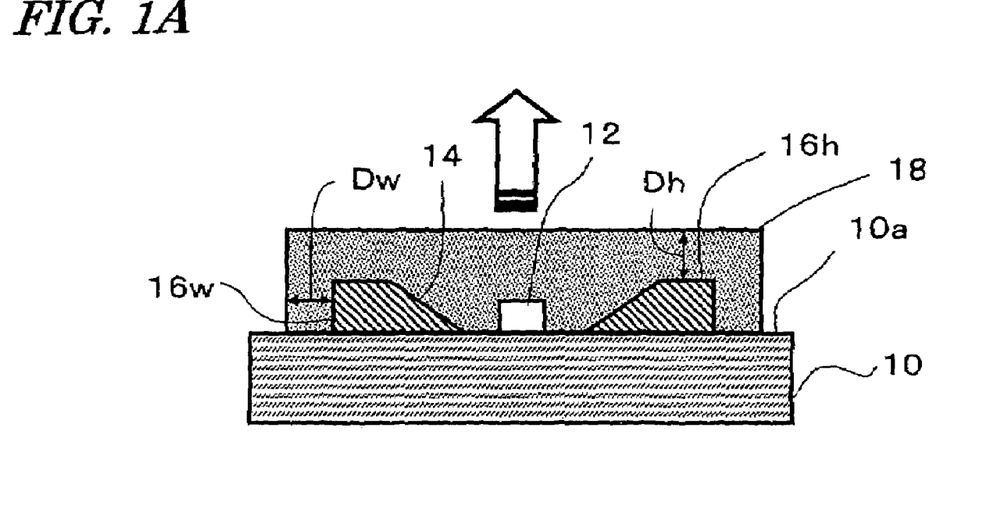
FIGS. 1A and 1B are respectively a cross-sectional view and a plan view schematically illustrating a configuration for an LED lamp according to the present invention.
Figure 1B:
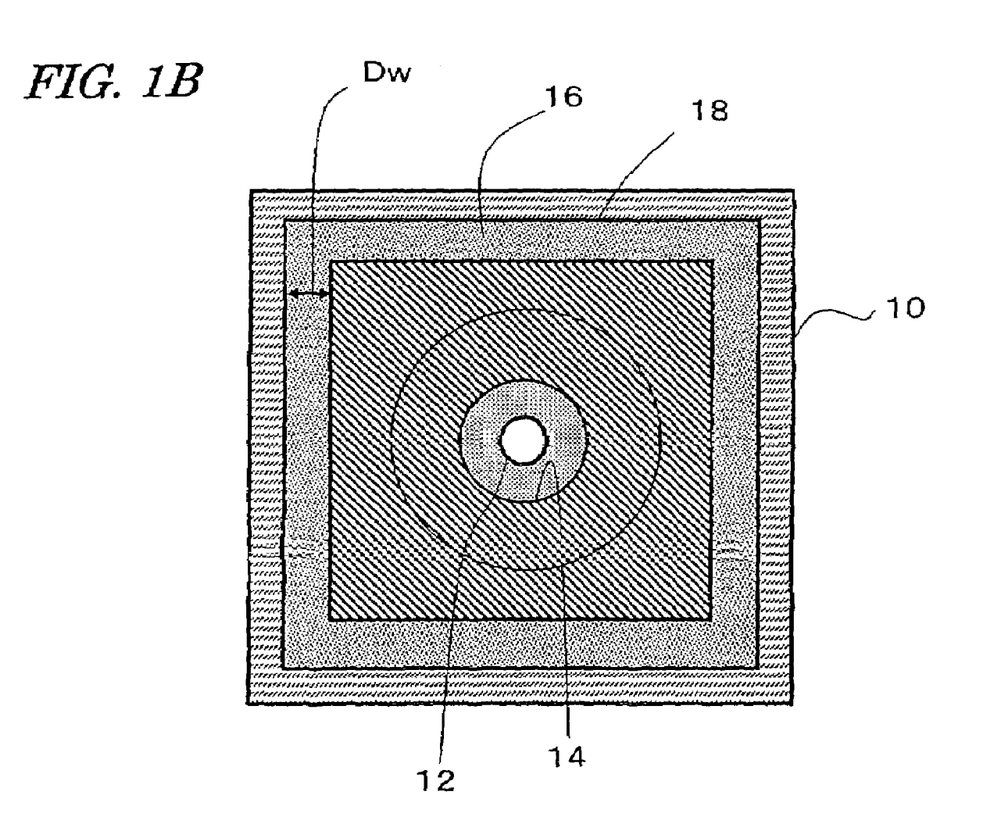

As shown in FIGS. 1A and 1B, an LED lamp according to the present invention includes a substrate 10 having a principal surface 10a, at least one LED 12, which is supported on the principal surface 10a of the substrate 10, and a reflector 16, which has an opening that defines a reflective surface 14 surrounding the side surface of the LED 12. The reflector 16 is also supported on the principal surface 10a of the substrate 10. The LED 12 and the reflector 16 are entirely covered with an encapsulating resin layer 18 such that the LED 12 is shut off from the air (i.e., encapsulated).

As will be described in detail later, the LED 12 preferably includes an LED bare chip and a phosphor resin that covers the chip. The emission of the LED 12 is transmitted through the encapsulating resin layer 18 and extracted in the direction pointed by the arrow in FIG. 1A. More specifically, a part of the emission of the LED 12 is reflected away by the reflective surface 14 of the reflector 16 and gone out of the encapsulating resin layer 18. Meanwhile, the rest of the emission of the LED 12 is not reflected by the reflective surface 14 but is transmitted through, and gone out of, the encapsulating resin layer 18.

Figure 2:
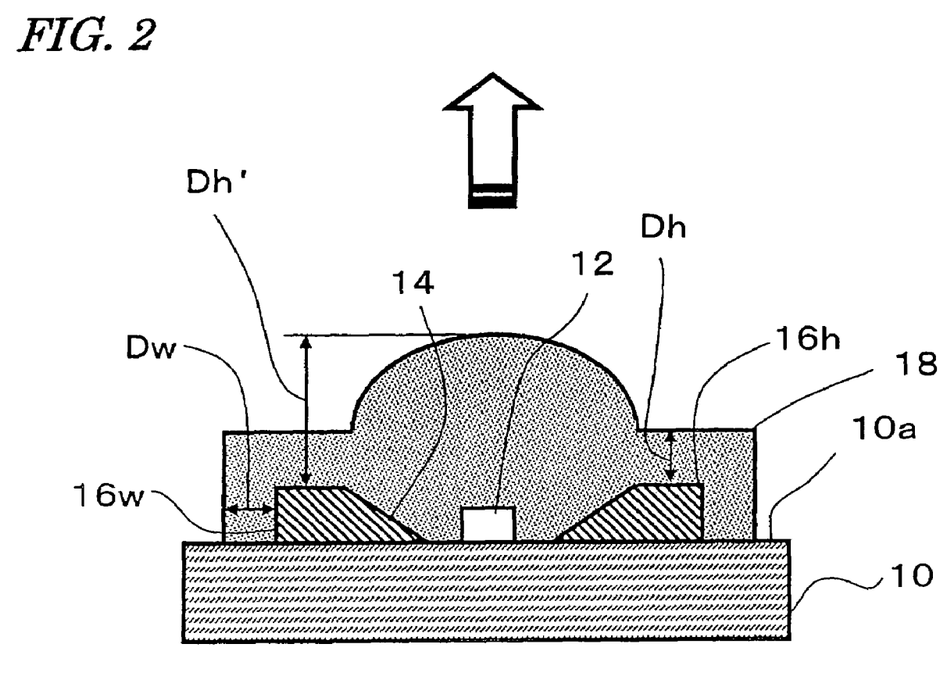
FIG. 2 is a cross-sectional view schematically illustrating a configuration for another LED lamp according to the present invention.

In the following description, a portion of the encapsulating resin layer 18 that covers the side surfaces 16w of the reflector 16 is supposed to have a thickness Dw and another portion of the encapsulating resin layer 18 that covers the upper surface 16h of the reflector 16 is supposed to have a thickness Dh. Although not shown in FIG. 1A, the encapsulating resin layer 18 may include a convex lens portion. FIG. 2 illustrates an encapsulating resin layer 18 with such a convex lens portion (which will be referred to herein as a "microlens portion"). In the LED lamp shown in FIG. 2, the portion that covers the upper surface 16h of the reflector 16 does not have a uniform thickness. The thickness Dh' of the microlens portion is the distance (i.e., the level difference) from the upper surface 16h of the reflector 16 to the top of the microlens portion. This thickness Dh' may be twice to twenty times as large as the thickness Dh. However, the thickness Dh' of such a microlens portion has almost no effects on the thermal shock resistance of the encapsulating resin layer 18. Rather, one of the most important parameters for the present invention is the thickness of the encapsulating resin layer 18 near the end surface of the reflector 16. Thus, the thickness Dh means herein the thickness of the encapsulating resin layer 18 near the end surface of the reflector 16.

To make the inner wall of the opening of the reflector 16 function as the reflective surface 14, the opening inner wall is preferably either curved or sloped to define a concave surface as shown in FIG. 1A.

Figure 3A:
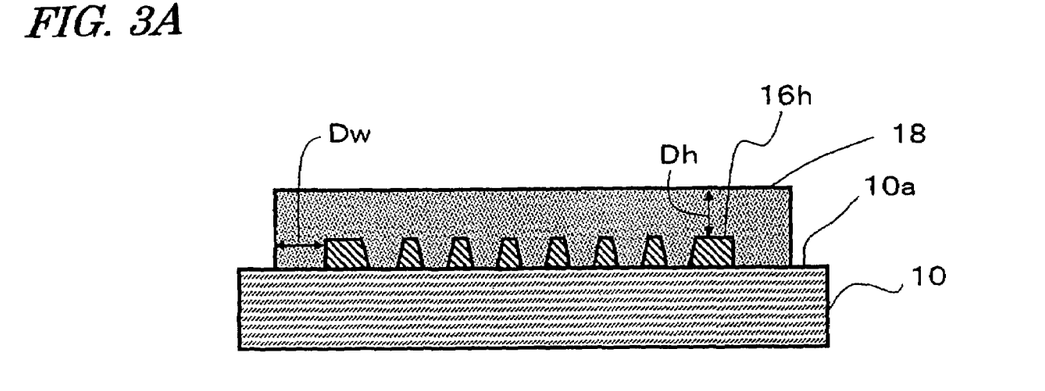
FIGS. 3A and 3B are respectively a cross-sectional view and a plan view schematically illustrating a configuration for still another LED lamp according to the present invention.
Figure 3B:
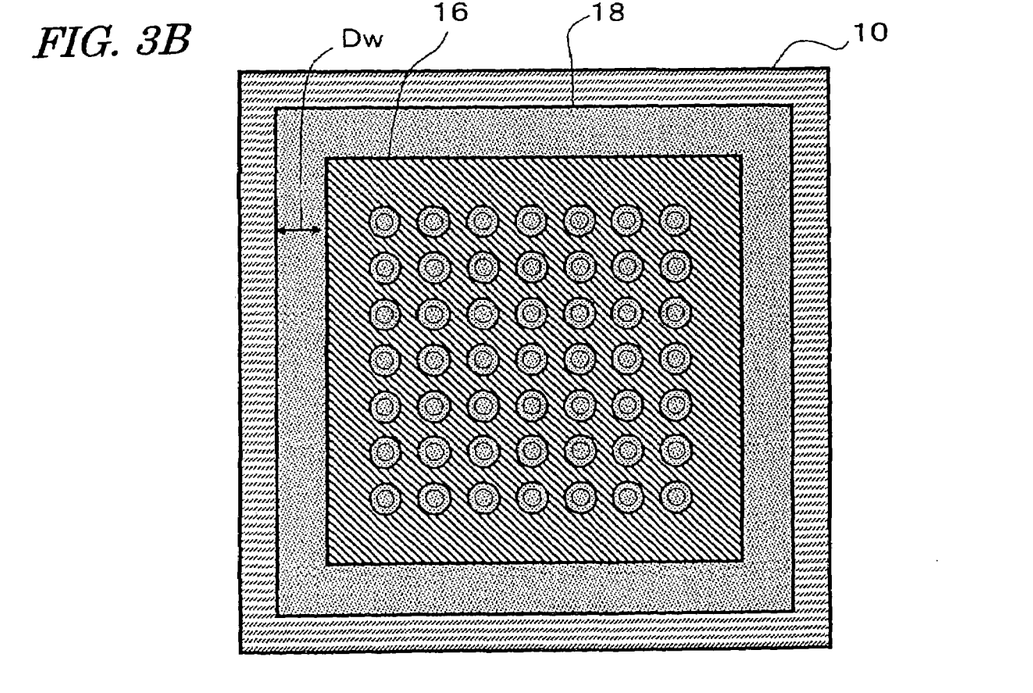

In the example illustrated in FIGS. 1A and 1B, only one LED is mounted on the substrate 10. However, to increase the luminous flux, multiple LEDs are preferably mounted on the same substrate 10. FIGS. 3A and 3B are respectively a cross-sectional view and a plan view of an LED lamp in which a seven by seven array of LEDs (i.e., 49 LEDs) is mounted on the substrate 10. In the example illustrated in FIGS. 3A and 3B, 49 openings are cut through the reflector 16 and an LED (not shown in FIG. 3) is located around the center of each of those openings. Even in such an example, the encapsulating resin layer 18 covers all of those LEDs as a single continuous layer.

According to the present invention, to minimize cracking of the encapsulating resin layer 18 and thereby increase the durability of the LED lamp, the Dh/Dw ratio is defined within the range of 1.2 to 1.8.

In the prior art, where an LED and a reflector are molded together with an encapsulating resin layer, a portion of the encapsulating resin layer is broadly extended outward from the edge of the reflector for some reasons in the manufacturing process. That is why in the conventional LED lamp, the Dh/Dw ratio is approximately equal to, or smaller than, one.

To explain the reasons why the Dh/Dw ratio is often smaller than one in the conventional LED lamp, a method of making the encapsulating resin layer 18 by a conventional transfer molding process will be described with reference to FIGS. 4A through 4C.

Figure 4A:
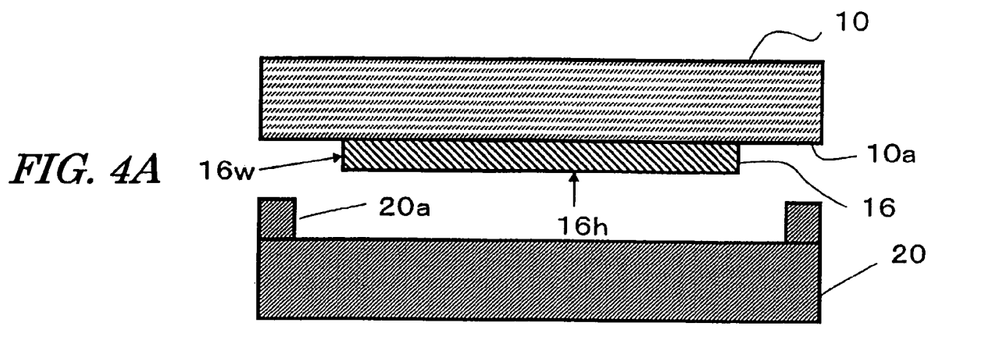
FIGS. 4A through 4C are cross-sectional views illustrating respective process steps of a conventional method of making an encapsulating resin layer.

First, as shown in FIG. 4A, a substrate 10, including an LED (not shown) and a reflector 16 on its principal surface 10a, is prepared. The LED (not shown) may have been ultrasonic flip-chip bonded to the substrate 10, for example. The reflector 16 may have been bonded to the principal surface of the substrate 10 with an adhesive layer, for example. Meanwhile, a molding die 20 that will define the shape of the resultant encapsulating resin layer 18 is prepared and set into a molding machine (not shown). The recess of the molding die 20 will define the profile of the encapsulating resin layer 18. More specifically, the inner wall 20a of the recess of the molding die 20 will define the upper and side surfaces of the encapsulating resin layer 18.

Figure 4B:
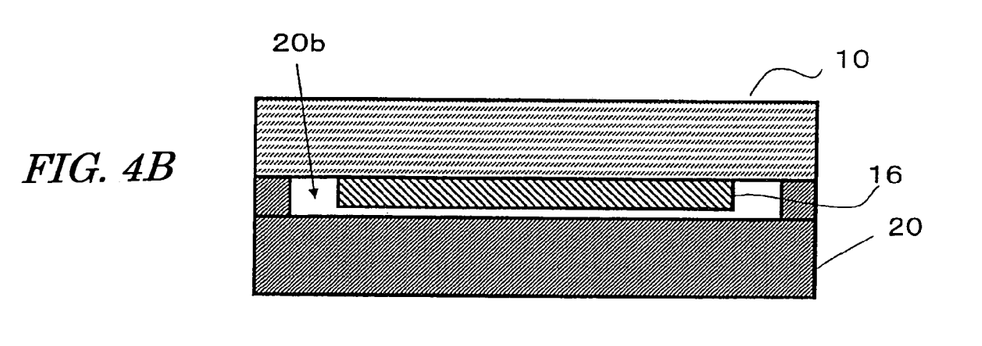
Figure 4C:
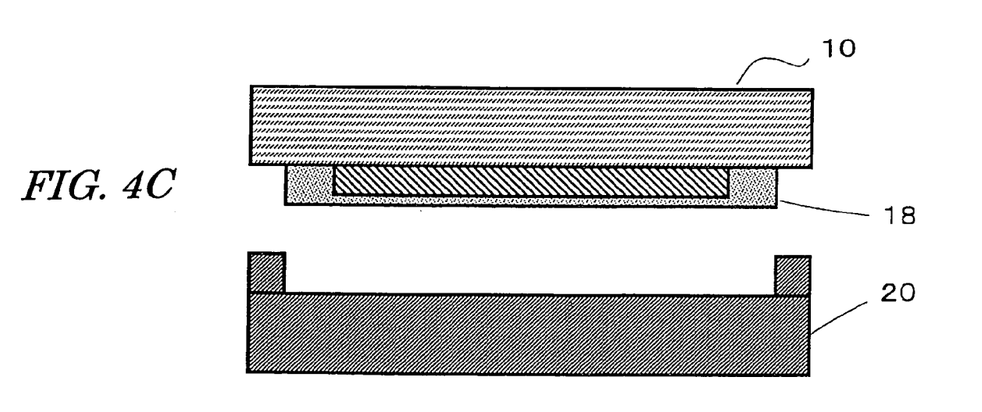

Next, as shown in FIG. 4B, the substrate 10 is pressed against the molding die 20 such that the reflector 16 is entirely enclosed in the recess of the molding die 20. In this process step, a gap 20b is created between the inner wall 20a of the molding die 20 and the upper and side surfaces of the reflector 16 and is filled with a resin. The resin is injected into the recess of the molding die 20 by way of a resin feeding path provided for the molding die 20.

The resin that has been injected into the gap 20b between the inner wall 20a of the molding die 20 and the upper and side surfaces of the reflector 16 is held at a temperature of 150° C. to 180° C. for approximately 3 to 5 minutes and soon cured while still receiving pressure. Thereafter, as shown in FIG. 4C, the substrate 10 is released from the molding die 20, thereby obtaining the encapsulating resin layer 18.

To press the substrate 10 with the reflector 16 against the molding die 20, the reflector 16 needs to be entirely enclosed in the recess of the molding die 20 as described above. In order to narrow the gap 20b between the inner wall 20a of the molding die 20 and the side surfaces of the reflector 16, the molding die 20 needs to be aligned with respect to the reflector 16 with increased accuracy.

In the prior art, a good alignment margin is afforded such that a sufficient gap is provided between the inner wall 20a of the molding die 20 and the side surfaces of the reflector 16. That is why in the resultant encapsulating resin layer 18, the portion that covers the side surfaces 16w of the reflector 16 has an increased thickness Dw and the Dh/Dw ratio is at most equal to, and often smaller than, one.

The present inventors presumed that the cracks of the encapsulating resin layer 18 might be caused due to a difference in thermal expansion coefficient between the encapsulating resin layer 18 and the substrate 10 or between the encapsulating resin layer 18 and the reflector 16. And we discovered that cracking could be minimized by reducing the thickness Dw of the portion of the encapsulating resin layer 18 covering the side surfaces of the reflector 16 such that the Dh/Dw ratio would fall within the range of 1.2 to 1.8 (as will be described more fully later), thus acquiring the basic idea of the present invention.

Hereinafter, a method of making the encapsulating resin layer 18 according to the present invention will be described with reference to FIGS. 5A through 5C.

Figure 5A:
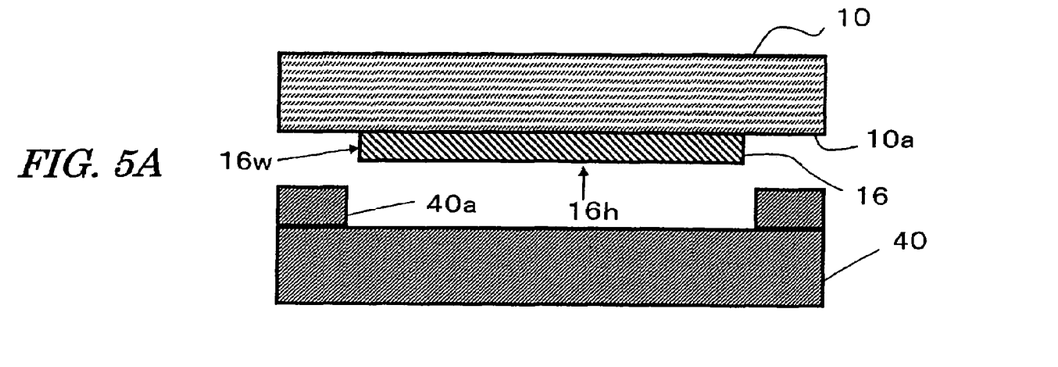
FIGS. 5A through 5C are cross-sectional views illustrating respective process steps of a method of making an encapsulating resin layer that can be used effectively in the present invention.

First, as shown in FIG. 5A, a substrate 10, including an LED and a reflector 16 on its principal surface 10a, and a molding die 40 are prepared. In the present invention, the recess of the molding die 40 has a different size from that of the conventional molding die 20.

Figure 5B:
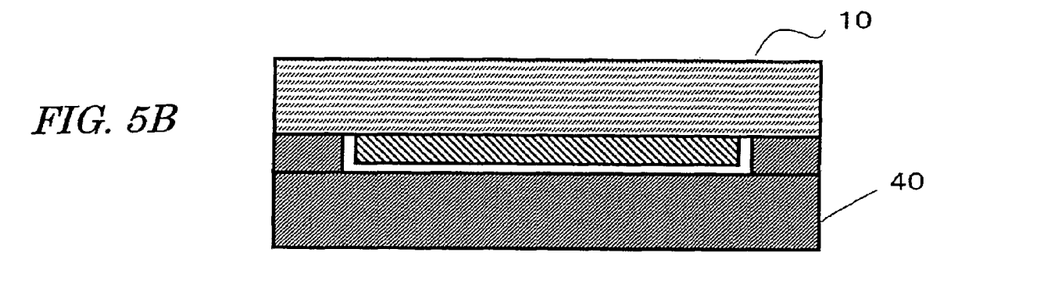
Figure 5C:
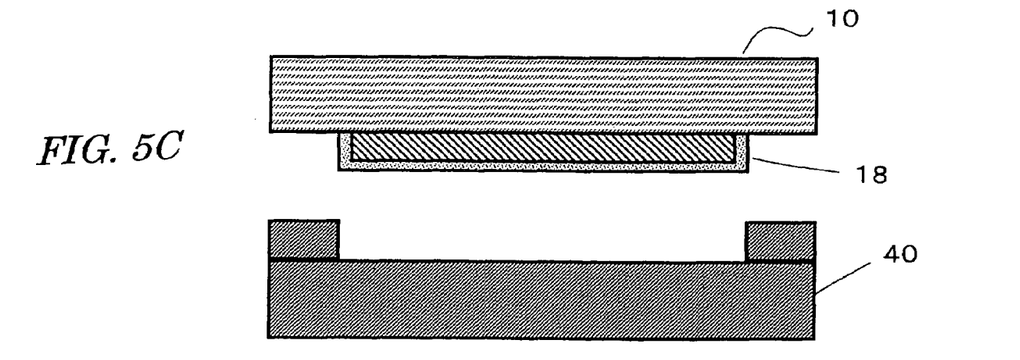

Next, as shown in FIG. 5B, the substrate 10 is pressed against the molding die 40 such that the reflector 16 is entirely enclosed within the recess of the molding die 40. In this process step, the gap created between the inner wall 40a of the molding die 40 and the upper surface of the reflector 16 is set to Dh and the gap created between the inner wall 40a of the molding die 40 and the side surfaces of the reflector 16 is set to Dw. The Dh/Dw ratio preferably falls within the range of 1.2 to 1.8.

Thereafter, those gaps are filled with a resin, which is then cured as in the conventional process. Finally, the substrate 10 is released from the molding die 40, thereby forming the encapsulating resin layer 18 as shown in FIG. 5C. The profile of the resultant encapsulating resin layer 18 is defined by the inner walls 40a of the recess of the molding die 40 and the Dh/Dw ratio falls within the range of 1.2 to 1.8.

Figure 6A:
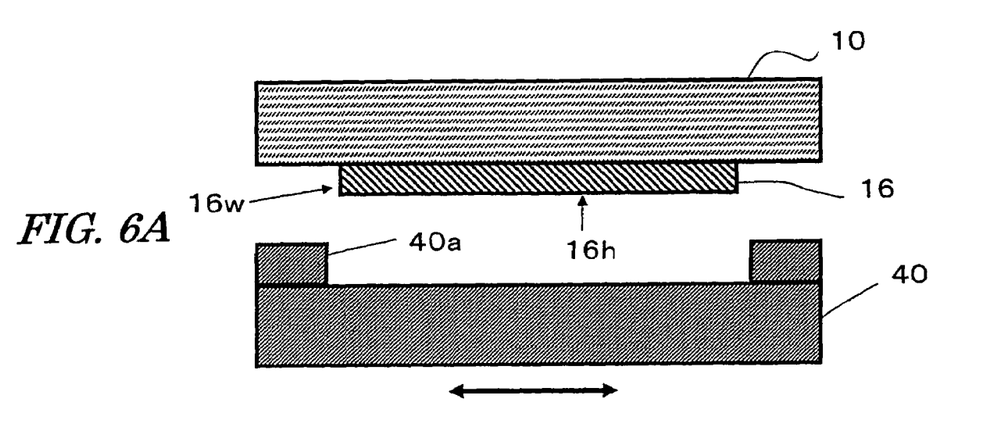
FIGS. 6A through 6C are cross-sectional views illustrating how misalignment may occur in the process of making the encapsulating resin layer.
Figure 6B:
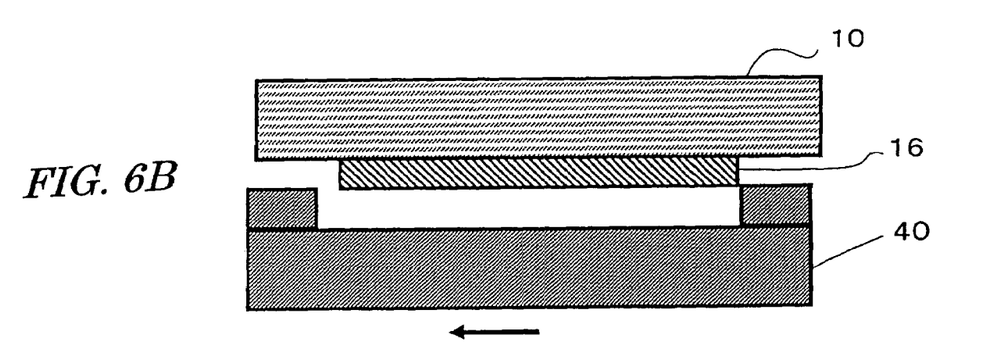
Figure 6C:
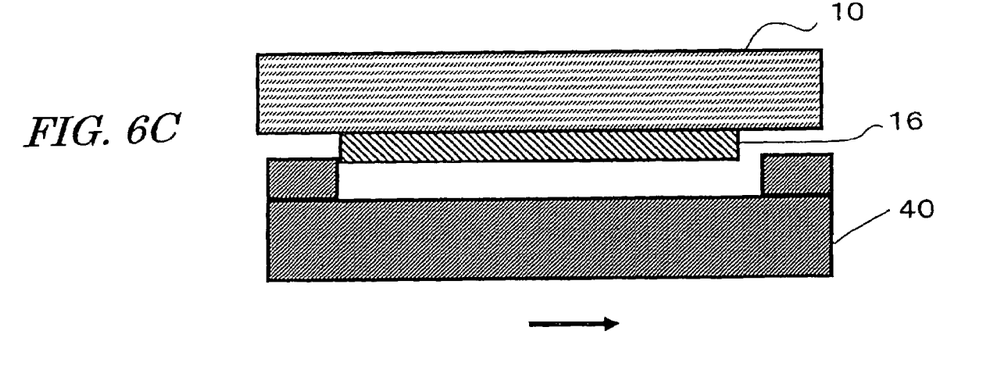

According to the present invention, in pressing the substrate 10 with the reflector 16 against the molding die 40, higher alignment accuracy needs to be achieved than in the conventional process. If this alignment accuracy were too low to appropriately align the molding die 40 and the substrate 10 with each other horizontally, then the reflector 16 could not be enclosed within the recess of the molding die 40 and the Dh/Dw ratio could not be controlled within the predetermined range, either. If the substrate 10 were misaligned with respect to the molding die 40 in one of the directions pointed by the arrow in FIG. 6A, then the reflector 16 might even contact with the molding die 40 as shown in FIG. 6B or 6C. Once such contact happened, the encapsulating resin layer 18 could not be formed anymore. Thus, according to the present invention, the encapsulating resin layer 18 is formed by using a molding machine that achieves high alignment accuracy to avoid such an inconvenience.

Hereinafter, specific preferred embodiments of the present invention will be described in detail with reference to the accompanying drawings.

EMBODIMENT

First, a preferred embodiment of an LED lamp according to the present invention will be described with reference to FIGS. 7 through 10.

Figure 7:
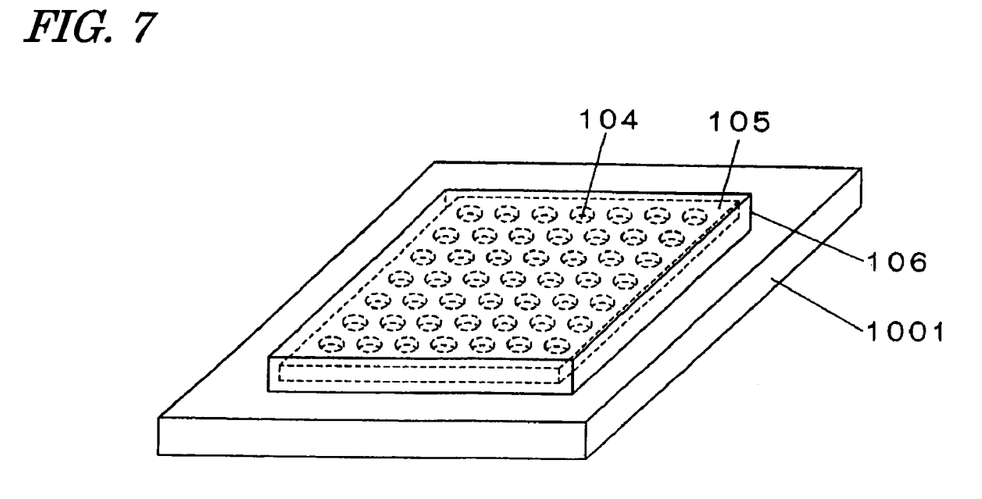
FIG. 7 is a schematic representation of an LED lamp according to a preferred embodiment of the present invention.

FIG. 7 is a perspective view illustrating a schematic appearance of an LED lamp according to this preferred embodiment. The illustration of wires and feeder pins for LED chips is omitted in FIG. 7 for the sake of simplicity.

Figure 8:
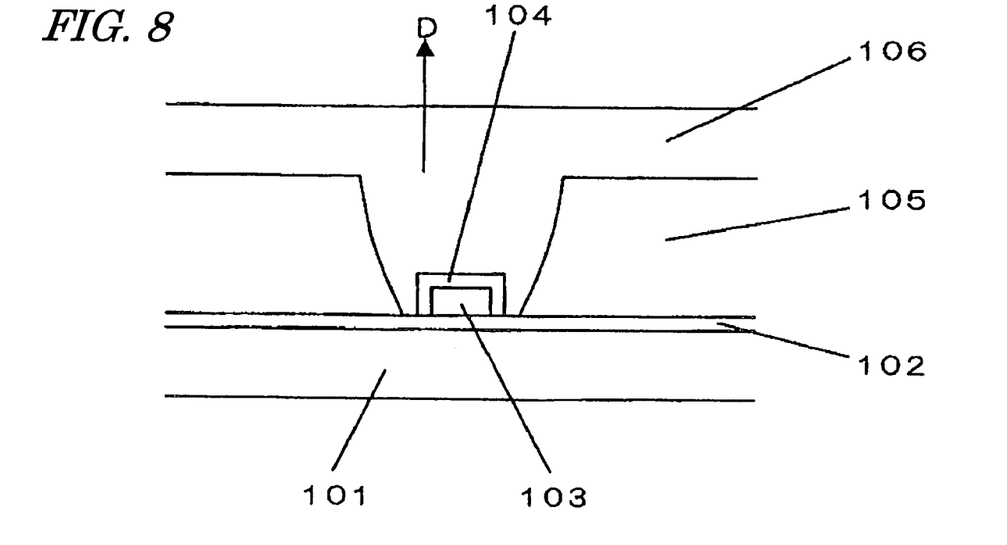
FIG. 8 is a partial cross-sectional view of an LED lamp according to a preferred embodiment of the present invention.

FIG. 8 is a cross-sectional view illustrating an LED chip 103 in an LED lamp according to this preferred embodiment and its surrounding portions on a larger scale.

In this preferred embodiment, a lot of LED chips are arranged as a two-dimensional array on a substrate 1001 in order to increase the luminous flux. The number of LED chips that are arranged on the single substrate 1001 may be 4 to 100, for example. However, this number varies on an application basis and may even deviate from this range, too. Also, when a big LED chip that can achieve a high luminous flux by itself is used, only one LED chip may be mounted on the substrate 1001. In this preferred embodiment, 49 LED chips are arranged as a seven by seven array on the substrate 1001.

According to the present invention, significant effects are achieved particularly when the quantity of heat generated by an LED in ON state is 2 W/cm$^2$ or more per unit area on the principal surface of the substrate. If the quantity of heat generated is that high, then the temperature of the LED lamp changes considerably as the lamp is turned ON and OFF. As a result, cracking would be produced easily due to the difference in thermal expansion coefficient mentioned above. When one big LED chip is mounted on the substrate, that LED chip may generate a heat of about 1 W. In that case, the quantity of heat generated per unit area will reach 4 W/cm$^2$ or more. As a result, the encapsulating resin layer will crack as easily as in a situation where a lot of LED chips are mounted. However, the present invention can minimize such cracking effectively.

In this preferred embodiment, each LED chip 103 is covered with a phosphor resin portion 104 including a phosphor as shown in FIG. 8. The phosphor resin portion 104 includes a phosphor (luminophor) for converting the emission of the LED chip 103 into light having a longer wavelength than that of the emission and a resin in which the phosphor is dispersed. The LED chip 103 is mounted on the upper surface of the substrate 1001. A wiring pattern (not shown) is also provided on the upper surface of the substrate 1001. And the LED chip 103 may be flip-chip bonded to a portion (e.g., a land) of the wiring pattern according to this preferred embodiment.

As shown in FIG. 7, a reflector 105 is arranged on the upper surface (i.e., the principal surface) of the substrate 1001. The reflector 105 has a plurality of openings, each of which surrounds its associated phosphor resin portion 104. The inner wall of each opening functions as a reflective surface for reflecting the emission of its associated LED chip 103.

In this preferred embodiment, the phosphor resin portions 104 and the reflector 105 are covered with the encapsulating resin layer 106 that is made of an epoxy resin. The encapsulating resin layer 106 prevents the external air from entering the openings of the reflector 105.

The substrate 1001 is preferably made of a material that has good heat dissipating property. In this preferred embodiment, the substrate 1001 includes a metal base 101 and a composite layer 102 as shown in FIG. 8. The metal base 101 is preferably made of a metallic material with high thermal conductivity such as aluminum (Al) or copper (Cu). The composite layer 102 may be made of a composite of alumina and an epoxy resin, for example. The composite layer 102 not only functions as an insulating layer but also exhibits good heat dissipating property. To achieve good heat dissipation, the composite layer 102 preferably has a thickness of 0.1 mm to 0.6 mm. In this preferred embodiment, the composite layer 102 has a thickness of 0.2 mm. The substrate 1001 may have an overall thickness of 0.1 mm to 5 mm, for example, which is preferably 0.5 mm to 3.0 mm in practice. In this preferred embodiment, the substrate 1001 has a thickness of 1.0 mm.

Such a composite substrate realizes high thermal conductivity (of 1.2° C./W or more, for example) and has excellent heat dissipating property. As a result, a large amount of current can flow through each LED chip while the increase in its temperature is reduced. Consequently, a high luminous flux can be obtained.

It should be noted that the substrate 1001 does not have to have such a configuration but may also be a ceramic substrate made of AlN, for example. In any case, however, the thermal expansion coefficient $n_1$ of the substrate 1001 is preferably controlled so as to fall within the range of $0.4 \times 10^{-5}$/K to $2.5 \times 10^{-5}$/K. In the substrate 1001 of this preferred embodiment, the thickness of the metal base 101 made of Al is three times or more as large as that of the composite layer 102. That is why the thermal expansion coefficient of the overall substrate 1001 is regulated by that of Al and is approximately $2.35 \times 10^{-5}$/K.

In a blue LED chip 103 currently on the market, its emission plane has a size of about 0.3 mm to about 2.0 mm each side. In this preferred embodiment, a square LED chip 103 with a 0.3 mm×0.3 mm emission plane is used. The LED chip 103 preferably has an emission center wavelength of about 400 nm to about 500 nm. In this preferred embodiment, an LED chip with an emission center wavelength of 470 nm is used to achieve sufficient luminous efficacy.

The phosphor resin portion 104 that covers the LED chip 103 is a resin consisting essentially of silicone and includes a phosphor. The phosphor may be $(Y \cdot Sm)_3(Al \cdot Ga)_5O_{12}$:Ce or $(Y_{0.39}Gd_{0.57}Ce_{0.03}Sm_{0.01})_3Al_5O_{12}$, for example.

The reflector 105 is subjected to a parabolic surface process so as to efficiently reflect the outgoing light of the phosphor resin portion 104 in the direction pointed by the arrow D. The reflector 105 is preferably made of Al or a resin. A reflector that can be used effectively in the present invention preferably has a thermal expansion coefficient $n_3$ of $2.3 \times 10^{-5}$/K to $8.6 \times 10^{-5}$/K. The reflector 105 preferably has a thickness of 0.5 mm to 2.0 mm. When the upper surface of the reflector 105 is rectangular, each side preferably has a length of 5 mm to 30 mm in practice. In this preferred embodiment, the reflector 105 is made of Al with a thermal expansion coefficient of $2.35 \times 10^{-5}$/K and has a thickness of 1.0 mm and a 20 mm×20 mm square profile on its upper surface.

The encapsulating resin layer 106 consists essentially of an epoxy resin and is transparent (has a visible radiation transmittance of about 98%/mm). The encapsulating resin layer 106 covers the phosphor resin portion 104 and the reflector 105. Thus, the LED chip 103 is encapsulated by the encapsulating resin layer 106 and the substrate 1001. The encapsulating resin layer preferably has a thermal expansion coefficient $n_2$ of $6.0 \times 10^{-5}$/K to $8.0 \times 10^{-5}$/K in practice. In this preferred embodiment, the encapsulating resin layer 106 has a thermal expansion coefficient of $6.5 \times 10^{-5}$/K.

An LED lamp with such a configuration was subjected to a heat shock test to see how many cracks were produced in the encapsulating resin layer 106 and whether or not there were leakages. More specifically, the test was carried out so as to comply with a JIS standard "JIS C 7021 A-3". The test was performed under the following conditions. First, an LED lamp according to this preferred embodiment was immersed in a liquid layer of 100° C. for 15 seconds and then transferred to a liquid layer of 0° C. within 3 seconds. Next, the LED lamp was immersed in the liquid layer of 0° C. for 5 minutes or more, transferred to the liquid layer of 100° C. again within 3 seconds and then held there for 15 seconds or more. These process steps were supposed to make up one cycle of heat shock and the number of heat shock cycles that the LED lamp went through until cracks or any other abnormality produced in the appearance of the encapsulating resin layer 106 was counted. The JIS standard requires a durability of at least 10 cycles.

Figure 9A:
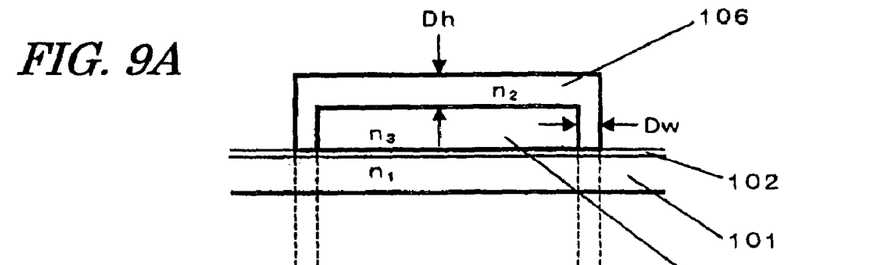
FIGS. 9A and 9B are respectively a cross-sectional view and a plan view of an LED lamp according to a preferred embodiment of the present invention.
Figure 9B:
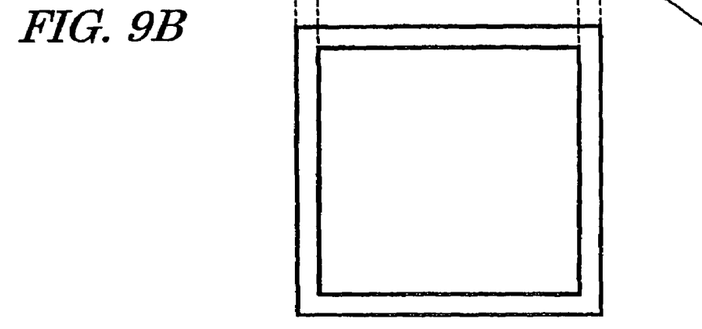

FIG. 9A is a side view of an LED lamp and FIG. 9B is a plan view thereof. In FIG. 9A, Dh denotes the thickness of the encapsulating resin layer 106 on the upper surface of the reflector 105 (i.e., the light outgoing surface of the reflector 105) and Dw denotes the average thickness of the encapsulating resin layer 106 on the side surfaces of the reflector 105 (i.e., the surfaces that cross the upper surface of the reflector 105 at right angles). The thickness of the encapsulating resin layer 106 changes from one point on a side surface of the reflector 105 to another. However, the variation should fall within the range of approximately ±10% of the average thickness Dw.

Figure 10:
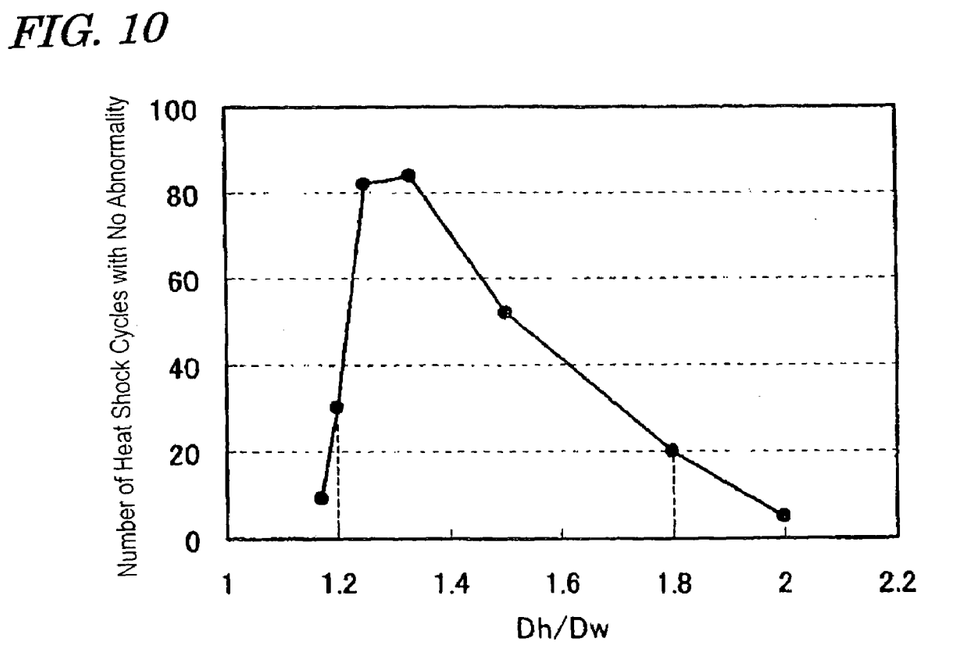
FIG. 10 is a graph showing the results of a heat cycle test that was carried out on an LED lamp according to a preferred embodiment of the present invention.

In this experiment, a number of samples were prepared with Dh and Dw both changed within the range of 100 µm to 1,500 µm and subjected to the heat shock test. FIG. 10 is a graph showing the results of the heat shock test. In FIG. 10, the abscissa represents the Dh/Dw ratio and the ordinate represents the number of heat shock cycles at which abnormality such as cracks was sensed for the first time on the appearance.

As can be seen from FIG. 10, when the Dh/Dw ratio falls within the range of 1.18 to 1.8, the LED lamp has a durability of at least 20 cycles. The durability of 20 cycles corresponds to a life of an LED lamp that has been turned ON and OFF 20,000 times and to a life of 20,000 hours under normal operating conditions.

Specifically, as the Dh/Dw ratio is increased from 1.18, the durability increases steeply. And a durability of 30 cycles is realized at a Dh/Dw ratio of 1.2 and a durability of 60 cycles is realized at a Dh/Dw ratio of 1.23. While the Dh/Dw ratio falls within the range of 1.23 to 1.45, an excellent durability of at least 60 cycles is realized. However, the durability reaches its peak at a Dh/Dw ratio of about 1.35. After that, the durability decreases as the Dh/Dw ratio increases. Nevertheless, the durability can be kept sufficiently high unless the Dh/Dw ratio exceeds 1.8.

Considering possible variations of a number of process parameters during the manufacturing process, the Dh/Dw ratio is preferably controlled within the range of 1.2 to 1.8. As long as the Dh/Dw ratio falls within this range, a durability of at least 10 cycles can be satisfied easily.

The durability against a heat shock decreases when the Dh/Dw ratio is less than about 1.2. The reason is believed to be as follows. Specifically, as the thickness Dw of the encapsulating resin layer 106 increases on the side surfaces of the reflector 105, the encapsulating resin layer 106 on the side surfaces of the reflector 105 thermally expands or shrinks more and more significantly parallel to the principal surface of the substrate. Meanwhile, the encapsulating resin layer 106 on the upper surface of the reflector 105 is also going to expand or shrink responsive to the expansion or shrinkage of the encapsulating resin layer 106 on the side surfaces of the reflector 105. However, unless the thickness Dh of the encapsulating resin layer 106 on the upper surface of the reflector 105 is sufficiently great, the degree of expansion or shrinkage produced parallel to the principal surface of the substrate differs greatly between the encapsulating resin layer 106 on the upper surface of the reflector 105 and the encapsulating resin layer 106 on the side surfaces of the reflector 105. In that case, cracks are easily created in the encapsulating resin layer 106 that surrounds the reflector 105 (near its four corners among other things). As the Dh/Dw ratio decreases toward one, the degree of expansion or shrinkage of the encapsulating resin layer 106 on the upper surface of the reflector 105 as produced parallel to the principal surface of the substrate decreases too steeply to cushion the expansion or shrinkage of the encapsulating resin layer 106 on the side surfaces of the reflector 105. As a result, the durability also drops noticeably.

It is generally difficult to make Dw smaller than Dh considering the manufacturing process normally adopted, which often results in a Dh/Dw ratio of 1 or less. That is why in a conventional LED lamp, cracks are particularly easily created at the four corners of the encapsulating resin layer 106 to shorten its life non-negligibly.

To reduce Dw, the molding machine should have increased alignment accuracy. Specifically, to minimize the cracking, Dw is preferably reduced to 900 µm or less, more preferably 600 µm or less. And if Dw should be reduced to such a value, a control operation needs to be carried out to increase the alignment accuracy of the molding machine to about 10% of Dw.

On the other hand, when the Dh/Dw ratio exceeds 1.8, the thickness Dh of the encapsulating resin layer 106 on the upper surface of the reflector 105 increases excessively. In that case, the encapsulating resin layer 106 on the side surfaces of the reflector 105 cannot sufficiently cushion the expansion or shrinkage of the encapsulating resin layer 106 on the upper surface of the reflector 105, thus creating cracks easily.

In the case where the encapsulating resin layer 106 is molded into a lens shape, the molding die should be formed so as to replicate the lens shape. When portion(s) of the encapsulating resin layer 106 is/are made to function as either a lens or an array of lenses, Dh represents the thickness of a non-lens portion of the encapsulating resin layer 106 as described above. This thickness Dh is preferably set to 700 µm to 800 µm, for example.

In the preferred embodiments described above, both the substrate and the reflector have square upper and lower surfaces. However, according to the present invention, the substrate and reflector do not have to have such a shape. Alternatively, the substrate and reflector may also have a cylindrical, conical or curved plate shape.

At the four corners of the reflector, a stress caused by the expansion or shrinkage of the encapsulating resin layer 106 is easily concentrated, thus creating cracks in the encapsulating resin layer 106. For that reason, the reflector preferably has a shape with rounded corners such as a cylindrical shape or a conical shape. When the reflector is a flat plate with circular upper and lower surfaces, the concentration of the stress due to the expansion or shrinkage of the encapsulating resin layer 106 will be relaxed. As a result, an LED lamp that has increased resistance to a heat shock can be obtained.

The upper surface of the substrate and the upper and lower surfaces of the reflector are preferably not so much curved as flat. This is because if these surfaces are flat, the resin can flow smoothly and the cracking and residual stress can be reduced while the encapsulating resin layer is being molded.

In the preferred embodiments described above, the phosphor resin portion consists essentially of a silicone resin, which has good translucency and achieves high light extraction efficiency. However, the present invention is in no way limited to those specific preferred embodiments but another other resin including a phosphor may also be used.

An LED lamp according to the present invention exhibits high reliability even with a heat shock presented, and therefore, can be used effectively not only as general illumination but also in a more severe operating environment.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. An LED lamp comprising:
   a substrate having a principal surface;
   at least one light emitting diode (LED) chip, the chip being supported on the principal surface of the substrate;
   a reflector having an upper surface and side surfaces, the reflector being supported on the principal surface of the substrate and including an opening that defines a reflective surface surrounding a side surface of the LED chip; and
   an encapsulating resin layer having a generally rectangular solid shape, which covers the LED chip and the entire upper surface and side surfaces of the reflector together, wherein a portion of the encapsulating resin layer that covers the side surfaces of the reflector has an average thickness Dw, another portion of the encapsulating resin layer that has a substantially uniform thickness and covers a peripheral region of the upper surface of the reflector has a thickness Dh, and wherein a Dh/Dw ratio is in the range of 1.2 to 1.8.

2. The LED lamp of claim 1, further comprising a wavelength converting portion, which is arranged between the reflective surface of the opening of the reflector and the surrounded LED chip so as to cover the LED chip, wherein the wavelength converting portion converts the emissions of the LED chip into light that has a longer wavelength than that of the emissions.

3. The LED lamp of claim 2, wherein the wavelength converting portion is made of a resin that includes a phosphor for converting emissions of the LED chip into the light that has the longer wavelength than that of the emissions.

4. The LED lamp of claim 1, wherein a portion of the encapsulating resin layer, located over the opening of the reflector, has a convex lens shape that sticks out of the portion that covers the upper surface of the reflector.

5. The LED lamp of claim 1, wherein the LED chip generates a heat of 1 W/cm$^2$ or more during its operation.

6. The LED lamp of claim 1, wherein the substrate has a thermal expansion coefficient $n_1$ of $0.4 \times 10^{-5}$/K to $2.5 \times 10^{-5}$/K, and
   wherein the encapsulating resin layer has a thermal expansion coefficient $n_2$ of $6.0 \times 10^{-5}$/K to $8.0 \times 10^{-5}$/K, and
   wherein the reflector has a thermal expansion coefficient $n_3$ of $2.3 \times 10^{-5}$/K to $8.6 \times 10^{-5}$/K.

7. The LED lamp of claim 1, wherein Dh is 100 μm to 1,500 μm and Dw is 100 μm to 1,500 μm.

8. The LED lamp of claim 1, wherein Dw is 100 μm to 900 μm.

9. The LED lamp of claim 1, wherein the reflector is a flat plate with the opening.

10. The LED lamp of claim 9, wherein the reflector has at least four openings including the opening.

11. The LED lamp of claim 1, wherein the encapsulating resin layer is made of a material consisting essentially of an epoxy resin.

12. The LED lamp of claim 1, wherein the upper surface of the reflector has a rectangular profile.

13. An illumination unit comprising:
   a light emitting diode (LED) lamp, and
   a circuit for supplying electrical power to the LED lamp, said LED lamp comprising:
      a substrate having a principal surface;
      at least one LED chip, the chip being supported on the principal surface of the substrate;
      a reflector having an upper surface and side surfaces, the reflector being supported on the principal surface of the substrate and including an opening that defines a reflective surface surrounding a side surface of the LED chip; and
      an encapsulating resin layer having a generally rectangular solid shape, which covers the LED chip and the entire upper surface and side surfaces of the reflector together, wherein a portion of the encapsulating resin layer that covers the side surfaces of the reflector has an average thickness Dw, another portion of the encapsulating resin layer that has a substantially uniform thickness and covers a peripheral region of the upper surface of the reflector has a thickness Dh, and wherein a Dh/Dw ratio is in the range of 1.2 to 1.8.

* * * * *